(12) United States Patent
Kim et al.

(10) Patent No.: US 8,354,789 B2
(45) Date of Patent: Jan. 15, 2013

(54) PIXEL ARRANGEMENT OF AN ORGANIC LIGHT EMITTING DISPLAY DEVICE

(75) Inventors: Gun-Shik Kim, Yongin (KR); Jae-Shin Kim, Yongin (KR); Jun-Sik Oh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 12/929,524

(22) Filed: Jan. 31, 2011

(65) Prior Publication Data
US 2011/0291549 A1 Dec. 1, 2011

(30) Foreign Application Priority Data

May 31, 2010 (KR) .................. 10-2010-0051019

(51) Int. Cl.
*H01J 1/62* (2006.01)
(52) U.S. Cl. ........ 313/504; 313/505; 313/507; 313/508; 445/24; 445/25
(58) Field of Classification Search ........... 313/500–512
See application file for complete search history.

(56) References Cited

U.S. PATENT DOCUMENTS

| | | | |
|---|---|---|---|
| 6,867,549 B2* | 3/2005 | Cok et al. ............. | 315/169.3 |
| 7,525,526 B2* | 4/2009 | Brown Elliott et al. ........ | 345/87 |
| 7,646,430 B2* | 1/2010 | Brown Elliott et al. ...... | 348/458 |
| 2002/0015110 A1* | 2/2002 | Brown Elliott ............... | 348/589 |
| 2009/0121983 A1* | 5/2009 | Sung et al. ..................... | 345/76 |

FOREIGN PATENT DOCUMENTS

| KR | 10 2003-0042603 A | 6/2003 |
|---|---|---|
| KR | 10 2004-0080442 A | 9/2004 |
| KR | 10 2006-0094092 A | 8/2006 |
| KR | 10 2007-0017349 A | 2/2007 |
| KR | 10 2010-0001598 A | 1/2010 |

OTHER PUBLICATIONS

Korean Office Action in KR 10-2010-0051019, dated Nov. 30, 2011 (Kim, et al.).

\* cited by examiner

*Primary Examiner* — Tracie Y Green
(74) *Attorney, Agent, or Firm* — Lee & Morse, P.C.

(57) ABSTRACT

A pixel arrangement of an organic light emitting display device includes first sub-pixels and second sub-pixels alternately arranged in a first direction to define a plurality of first columns along the first direction, and third sub-pixels arranged along the first direction to define a plurality of second columns along the first direction among the first columns, two second columns of the third sub-pixels being arranged among three first columns of the alternating first and second sub-pixels.

16 Claims, 1 Drawing Sheet

PIXEL ARRANGEMENT OF AN ORGANIC LIGHT EMITTING DISPLAY DEVICE

BACKGROUND

1. Field

The embodiment relates to a pixel arrangement of an organic light emitting display device, and more particularly, to a pixel arrangement of an organic light emitting display device with improved aperture ratio and definition.

2. Description of the Related Art

An organic light emitting display device displays images by using an organic light emitting diode (OLED), i.e., an auto emission device, and has been noticed as a next generation display device due to its excellent luminance and color purity. The organic light emitting display device may display images of various colors by using red sub-pixels, green sub-pixels, and blue sub-pixels.

SUMMARY

Embodiments are directed to a pixel arrangement, which substantially overcomes one or more of the problems due to the limitations and disadvantages of the related art.

It is therefore a feature of an embodiment to provide a pixel arrangement of an organic light emitting display device with an improved definition and aperture ratio.

At least one of the above and other features and advantages may be realized by providing a pixel arrangement of an organic light emitting display device, including first sub-pixels and second sub-pixels alternately arranged in a first direction to define a plurality of first columns along the first direction, and third sub-pixels arranged along the first direction to define a plurality of second columns along the first direction among the first columns, two second columns of the third sub-pixels being arranged among three first columns of the alternating first and second sub-pixels.

The first sub-pixels and the second sub-pixels may be alternately arranged in a second direction perpendicular to the first direction to define a plurality of rows along the second direction. A distance between a first sub-pixel and an adjacent second sub-pixel in each row substantially may equal a distance between two adjacent third sub-pixels along the second direction. The third sub-pixel may be a green sub-pixel, the first sub-pixel is a red sub-pixel, and the second sub-pixel is a blue sub-pixel. A combined length of four of the first and second alternating sub-pixels with the distances therebetween along the first direction may be longer than a combined length of two third sub-pixels and a distance therebetween along the first direction. The third sub-pixels may be arranged to have two rows of third sub-pixels among three rows of alternating first and second sub-pixels, the rows of third sub-pixels and alternating first and second sub-pixels extending along a second direction perpendicular to the first direction. A second row of the alternating first and second sub-pixels may extend between the two rows of the third sub-pixels. A second row of the alternating first and second sub-pixels may not overlap the third sub-pixels. Two third sub-pixels in the second column may be arranged to overlap only three of the alternating first and second sub-pixels in the first column.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
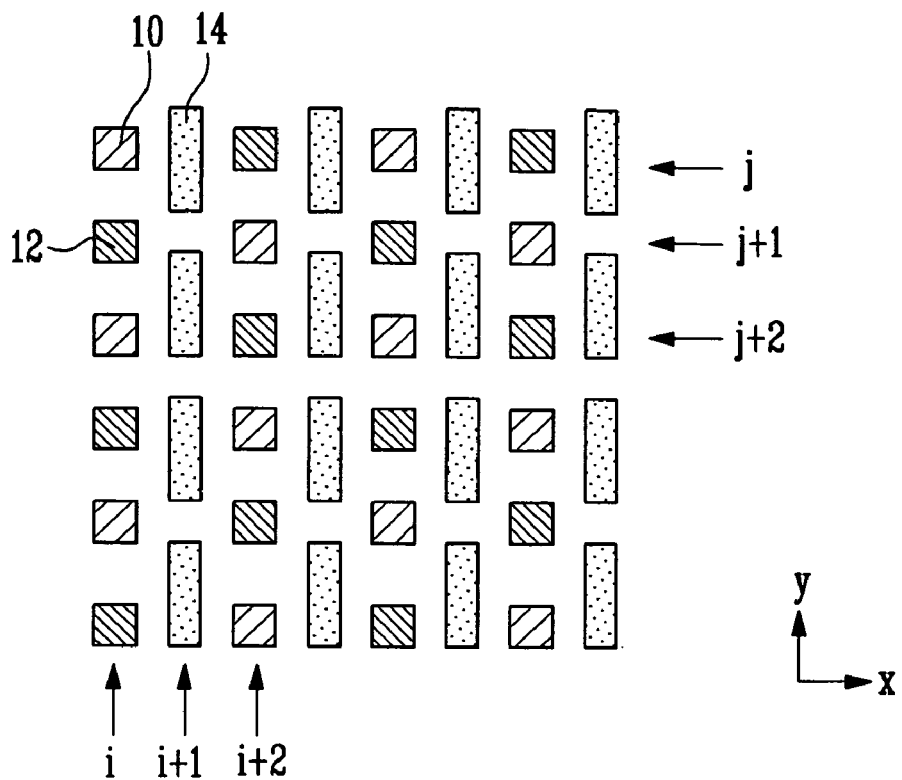
FIG. 1 illustrates a plan view of a pixel arrangement of an organic light emitting display device according to an embodiment.

Korean Patent Application No. 10-2010-0051019, filed on May 31, 2010, in the Korean Intellectual Property Office, and entitled: "Pixel Array for Organic Light Emitting Display Device" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "between" two elements, it can be the only element between the two elements, or one or more intervening elements may also be present. Like reference numerals refer to like elements throughout.

FIG. 1 illustrates a plan view of a pixel arrangement of an organic light emitting display device according to an embodiment. Referring to FIG. 1, the pixel arrangement of the organic light emitting display device according to an embodiment may include a first sub-pixel 10, a second sub-pixel 12, and a third sub-pixel 14.

The first sub-pixel 10 emits light having a first color, the second sub-pixel 12 emits light having a second color, and the third sub-pixel 14 emits light having a third color. For example, the first through third colors may be three different colors. The first sub-pixel 10, the second sub-pixel 12, and the third sub-pixel 14 may be repeatedly arranged in a predetermined pattern, e.g., in a constantly repeating pattern.

The first sub-pixel 10 and the second sub-pixel 12 may be alternately arranged in a same column along a first direction, e.g., along the y-axis, and in a same row along a second direction perpendicular to the first direction, e.g., along the x-axis. For example, the first and second sub-pixels 10 and 12 may be arranged in an alternating matrix pattern, e.g., a first sub-pixel 10 may be separated from an adjacent first sub-pixel 10 along the first and second directions via second sub-pixels 12.

For example, the first sub-pixel 10 and the second sub-pixel 12 may be sequentially and alternately arranged in a specific row j (j is a natural number), such that the first and second sub-pixels 10 and 12 may be positioned in positions i (i is a natural number) and i+2, respectively, within row j. Further, the second sub-pixel 12 and the first sub-pixel 10 may be sequentially and alternately arranged in an adjacent row, i.e., row j+1, such that the second and first sub-pixels 12 and 10 may be positioned in the positions i and i+2, respectively, within row j+1. Such a configuration of rows and columns of the first and second sub-pixels 10 and 12 may be arranged repeatedly and sequentially along the first and second directions.

The third sub-pixel 14 may be arranged in a column along the first direction to be adjacent to the column of the alternating first sub-pixels 10 and second sub-pixels 12, e.g., the columns may be adjacent to each other along the second direction. That is, the third sub-pixel 14 may be formed between columns of the first sub-pixel 10 and the second sub-pixel 12, e.g., the third sub-pixel 14 may be in a position i+1 within row j. In this case, two columns of third sub-pixels 14 may be formed among three columns of first and second sub-pixels 10 and 12. For example, as illustrated in FIG. 1, the first sub-pixel 10 and the second sub-pixel 12 may be alternately and sequentially arranged in each of columns i, i+2, i+4, . . . , so a plurality of third sub-pixel 14 may be arranged in each of columns i+1, i+3, i+5, . . . . As such, two rows of third sub-pixels 14 may be arranged among three rows of alternating first and second sub-pixels 10 and 12, e.g., there may be only two rows of third sub-pixels 14 among the three rows j, j+1, and j+2.

A length of the third sub-pixel 14 along the first direction, i.e., along the y-axis, may be longer than a length of each of the first and second sub-pixels 10 and 12 along the first direction. For example, as illustrated in FIG. 1, when three first and second sub-pixels 10 and 12 are aligned in one column, e.g., when a first sub-pixel 10, a second sub-pixel 12, and a first sub-pixel 10 are aligned in column i and in respective rows j+2, j+1, and j, two third sub-pixels 14 aligned in an adjacent column, i.e., in column i+1, may extend to a further distance than the three first and second sub-pixels 10 and 12. In this case, when bottoms of a first third sub-pixel 14 and the first sub-pixel 10 in row j+2 are aligned, an edge of the second third sub-pixel 14 may extend beyond the first sub-pixel 10 in row j.

Meanwhile, the first through third sub-pixels 10, 12, 14 may be alternately arranged in rows j, j+2, j+4, . . . , e.g., the first sub-pixel 10, the third sub-pixel 14, the second sub-pixel 12, and the third sub-pixel 14 may be arranged in the stated order in rows j, j+2, j+4 . . . . In other words, the sub-pixels may be arranged in half of the rows, i.e., in rows j, j+2, j+4 . . . , to have a pixel arrangement of the pentile matrix color pixel arrangement, so the organic light emitting display device may be driven in a same driving way.

For example, for rows j+1 and j+2, the first sub-pixel 10 and the second sub-pixel 12 may be arranged in specific columns, and the third sub-pixel 14 may be arranged in an adjacent column. In this case, the first sub-pixel 10, the second sub-pixel 12, and the third sub-pixel 14 formed to be adjacent to each other may be driven as one pixel.

A distance between the first sub-pixel 10 and the second sub-pixel 12 along the second direction, i.e., along the x-axis, and a distance between adjacent third sub-pixels 14 along the second direction may be substantially the same. In this case, a number of the first sub-pixels 10, e.g., the red sub-pixels, and the second sub-pixels 12, e.g., the blue sub-pixels, may increase, as compared to the conventional pentile matrix color pixel arrangement. An organic light emitting display device having an increased number of red and blue pixels according to example embodiments may be implemented in a panel having at least 200 ppi.

Figure 2:
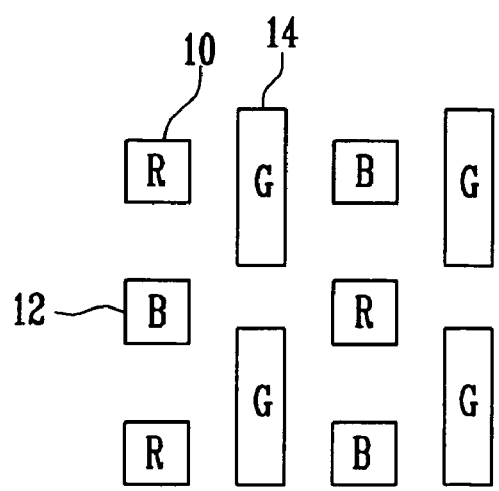
FIG. 2 illustrates a plan view of an example of a color arrangement that can be applied in a sub-pixel group of FIG. 1.

FIG. 2 illustrates a plan view of an example of color arrangement that can be applied in a sub-pixel group of FIG. 1. Referring to FIG. 2, the first sub-pixel 10 may be set up as the red sub-pixel R, the second sub-pixel 12 may be set up as the blue sub-pixel B, and the third sub-pixel 14 may be set up as the green sub-pixel G. The number of the third sub-pixels 14 is larger than the number of the first sub-pixels 10 (or the second sub-pixels 12). Therefore, when the third sub-pixel 14 is set up as the green sub-pixel G, an image having a high quality may be displayed.

A pixel arrangement in an organic light emitting display device according to an embodiment may be applied in a panel having at least 200 ppi because of an increased number of red sub-pixels and blue sub-pixels, as compared to the conventional pentile matrix color pixel arrangement. In addition, as the number of the red and blue sub-pixels is reduced, as compared to a conventional stripe configuration, the aperture ratio and the expression ability of the high-resolution may be improved, e.g., due to a structure of a vertical line pattern with a special pixel that is not admitted.

In contrast, when the red sub-pixels, the green sub-pixels, and the blue sub-pixels are arranged in a conventional stripe configuration, i.e., where sub-pixels having the same color are arranged in a same row, an aperture ratio may be decreased and high-resolution may be reduced due to a black matrix arranged between sub-pixels. Further, in a conventional pentile matrix color pixel arrangement proposed by the ClairVoyante Laboratories Corporation, even though the red sub-pixels and the blue sub-pixels are alternatively formed in a same row, which is adjacent to a row of the green sub-pixels, the definition below 250 ppi may be too low, thereby reducing display quality.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A pixel arrangement of an organic light emitting display device, comprising:
   first sub-pixels and second sub-pixels alternately arranged in a first direction to define a plurality of first columns along the first direction; and
   third sub-pixels arranged along the first direction to define a plurality of second columns along the first direction one second column being between two first columns,
   wherein a length of each third sub-pixel along the first direction is longer than a length of each of the first and second sub-pixels along the first direction, and
   wherein the length of each third sub-pixel along the first direction is shorter than a combined length of two of the first and second sub-pixels and a distance therebetween along the first direction, two third sub-pixels in the second column being arranged to overlap only three of the alternating first and second sub-pixels in the first column.

2. The pixel arrangement of the organic light emitting display device as claimed in claim 1, wherein the first sub-pixels and the second sub-pixels are alternately arranged in a second direction perpendicular to the first direction to define a plurality of rows along the second direction.

3. The pixel arrangement of the organic light emitting display device as claimed in claim 2, wherein a distance between a first sub-pixel and an adjacent second sub-pixel in each row substantially equals a distance between two adjacent third sub-pixels along the second direction.

4. The pixel arrangement of the organic light emitting display device as claimed in claim 1, wherein the third sub-pixel is a green sub-pixel, the first sub-pixel is a red sub-pixel, and the second sub-pixel is a blue sub-pixel.

5. The pixel arrangement of the organic light emitting display device as claimed in claim 1, wherein a combined length of four of the first and second alternating sub-pixels with the distances therebetween along the first direction is longer than a combined length of two third sub-pixels and a distance therebetween along the first direction.

6. The pixel arrangement of the organic light emitting display device as claimed in claim 2, wherein three rows of the alternating first and second sub-pixels correspond to two rows of third sub-pixels along the second direction.

7. The pixel arrangement of the organic light emitting display device as claimed in claim 6, wherein a second row of the alternating first and second sub-pixels extends between the two rows of the third sub-pixels.

8. The pixel arrangement of the organic light emitting display device as claimed in claim 6, wherein a second row of the alternating first and second sub-pixels does not overlap the third sub-pixels.

9. The pixel arrangement of the organic light emitting display device as claimed in claim 1, wherein the two third sub-pixels in the second column are arranged to overlap an entire combined length of the three of the alternating first and second sub-pixels in the first column.

10. The pixel arrangement of the organic light emitting display device as claimed in claim 1, wherein a combined length of three of the first and second alternating sub-pixels with the distances therebetween along the first direction is shorter than a combined length of two third sub-pixels and a distance therebetween along the first direction.

11. The pixel arrangement of the organic light emitting display device as claimed in claim 1, wherein a total number of first and second sub-pixels is larger than a total number of the third sub-pixels.

12. The pixel arrangement of the organic light emitting display device as claimed in claim 11, wherein the total number of the third sub-pixels is larger than one third of a total number of the first through third sub-pixels.

13. The pixel arrangement of the organic light emitting display device as claimed in claim 1, wherein the two third sub-pixels are adjacent to each other in a same second column, and the three alternating first and second sub-pixels are adjacent to each other in a same first column.

14. The pixel arrangement of the organic light emitting display device as claimed in claim 13, wherein the two third sub-pixels are spaced apart from each other along the first direction, one of the three alternating first and second sub-pixels being positioned to correspond to the space between the two third sub-pixels.

15. The pixel arrangement of the organic light emitting display device as claimed in claim 6, wherein only half of the rows include the first sub-pixels, the second sub-pixels, and the third sub-pixels.

16. The pixel arrangement of the organic light emitting display device as claimed in claim 6, wherein the rows of sub pixels include alternating first and second rows, the first rows include first through third sub-pixels, and the second rows include only first and second sub-pixels.

* * * * *